United States Patent [19]

Toyoshima et al.

[11] Patent Number: 4,727,327

[45] Date of Patent: Feb. 23, 1988

[54] APPARATUS FOR OBTAINING IMAGE INFORMATION THROUGH USE OF A NUCLEAR MAGNETIC RESONANCE SIGNAL

[76] Inventors: Hideo Toyoshima, 5-5-11, Kamiimaizumi, Ebina-shi, Kanagawa; Masaya Yamashita, Kibohgaoka 2nd Koporasu E 401, 144, Nakakibohgaoka, Asahi-ku, Yokohama-shi, Kanagawa, both of Japan

[21] Appl. No.: 814,123

[22] Filed: Dec. 27, 1985

[30] Foreign Application Priority Data

Dec. 30, 1984 [JP] Japan .................... 59-201444[U]

[51] Int. Cl.⁴ .................................... G01R 33/20
[52] U.S. Cl. ............................. 324/309; 324/318
[58] Field of Search ............ 324/300, 307, 309, 318, 324/319, 322; 128/653; 335/213, 296, 297; 336/225, 227, 232

[56] References Cited

U.S. PATENT DOCUMENTS

| | | | |
|---|---|---|---|
| 4,411,270 | 10/1983 | Damadian | 324/309 |
| 4,467,303 | 8/1984 | Laskaris | 335/216 |
| 4,480,228 | 10/1984 | Bottomley | 324/309 |
| 4,590,427 | 5/1986 | Fukushima | 324/318 |
| 4,590,947 | 5/1986 | Krause | 324/318 |

FOREIGN PATENT DOCUMENTS 42255 12/1981 European Pat. Off. .
WO84/01226 3/1984 PCT Int'l Appl. .

*Primary Examiner*—Michael J. Tokar
*Attorney, Agent, or Firm*—Sughrue, Mion, Zinn, Macpeak, and Seas

[57] ABSTRACT

A static magnetic field and a gradient magnetic field which is of the same direction as the former but the intensity of which is graded in three intersecting directions are applied to an examinee's body so that space information therefrom can be discriminated. High-frequency pulses are applied by a solenoid coil and/or a surface coil to the examinee's body and a nuclear magnetic resonance signal therefrom is received to obtain the spatial distribution of information contained in the received signal. A static field generating means is constructed so that the static magnetic field is directed horizontal and the examinee's body is brought into and out of the static magnetic field perpendicularly thereto from the horizontal direction. The axis of the solenoid coil crosses the static magnetic field perpendicularly thereto and is held horizontal, and the examinee's body can be positioned in the solenoid coil. The surface coil whose RF direction is vertical is disposed in adjacent relation to a target region of the examinee's body so that the nuclear magnetic resonance signal can also be received by the surface coil.

16 Claims, 19 Drawing Figures

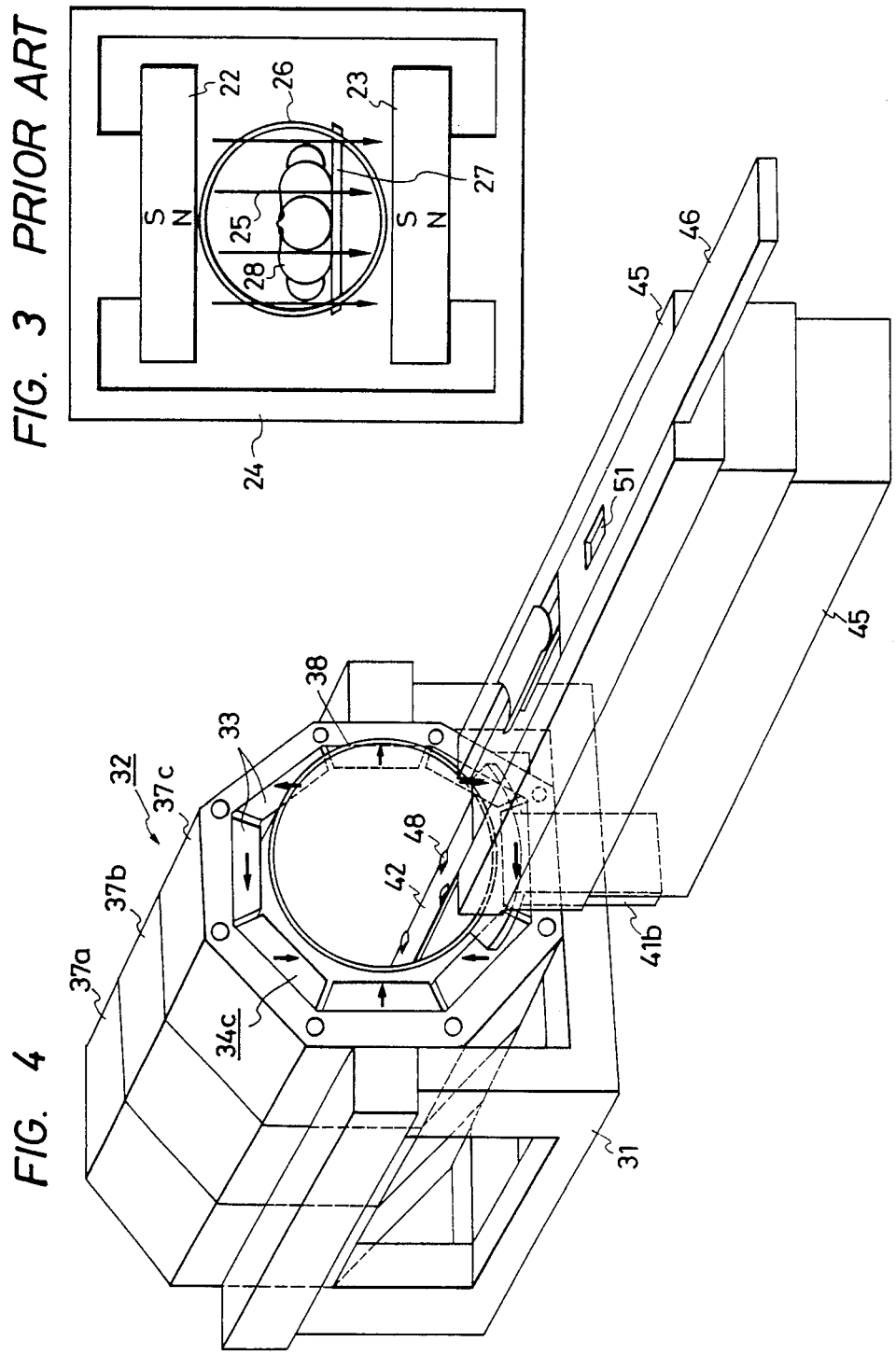

APPARATUS FOR OBTAINING IMAGE INFORMATION THROUGH USE OF A NUCLEAR MAGNETIC RESONANCE SIGNAL

BACKGROUND OF THE INVENTION

The present invention relates to an apparatus for obtaining image information from a living body under examination through use of a nuclear magnetic resonance signal, and more particularly to the relative arrangement of its static magnetic field and radio-frequency magnetic field and the examinee's body.

Many literatures have already been published on apparatus for obtaining image information from a living body particularly, human body through utilization of a nuclear magnetic resonance (hereinafter referred to simply as NMR) signal (which apparatus will hereinafter be referred to as the NMR-CT apparatus).

To begin with, the NMR phenomenon occurs through such a mechanism as follows: When placed in a static magnetic field, atomic nuclei resonate with a component of a radio-frequency magnetic field (hereinafter referred to as RF magnetic field or simply as RF field) of a specified frequency proportional to the intensity of the static magnetic field (which may hereinafter be referred to as static field which is perpendicular to that component, and precess about an axis in the direction of application of the static magnetic field at the above frequency (a resonance frequency). By the precession the atomic nuclei absorb the energy of the RF magnetic field and are excited and upon completion of the excitation, they relax while releasing, as an NMR signal, a portion of the absorbed energy of the RF field. The resonance frequency is known under the name of a Larmor frequency and is given by $\omega_e = \gamma \cdot H_e$, where $\gamma$ is a nuclear gyromagnetic ratio and $H_e$ is the intensity of the static magnetic field.

Then, when a magnetic field which has the same direction as the static magnetic field and whose intensity varies along a specified direction, that is, a so-called gradient magnetic field (which may hereinafter be referred to as gradient field), is superimposed on the spatially homogeneous static magnetic field, atomic nuclei (hereinafter referred to as nuclear spins) at respective coordinates in the above specified direction precess at different frequencies by virtue of the RF magnetic field.

It can be said that it is the NMR-CT that obtains, by an ingenious utilization of abovementioned property, the spatial distribution of information (the nuclear spin density, the relaxation time, etc.) contained in the NMR signal. FIG. 1 illustrates in block form specific constituents of the NMR-CT apparatus. A static magnetic field generating magnet 11 applies a static magnetic field to a living body (not shown) and a gradient magnetic field generating coil 12 applies thereto a gradient magnetic field. The gradient field is identical in direction with the static field and its intensity is graded in three directions which usually intersect one another at right angles. This field arrangement permits discrimination of spatial information of the body. RF power in the resonance frequency band is provided from a transmitter 13 via an automatic transmission/reception switching circuit 14 to an RF coil 15. An RF magnetic field, which is perpendicular to the static field, is applied from the RF coil 15 to the body. The resulting NMR signal from the body is received by the RF coil 15, from which it is supplied to a receiver 17 via the automatic transmission/reception switching circuit 14 and a receiving coil select circuit 16. After being amplified and detected in the receiver 17 the NMR signal is converted by an A/D converter 18 into a digital signal. The digital signal is provided to a computer 19, in which it is subjected to a calculation process for image reconstruction, etc., and its results are displayed as an image on a display 20. The static field generating magnet 11 is excited by a static field generating means 11a and the gradient field generating coil 12 by a gradient field generating means 12a.

When the direction of the magnetic fields emanating from the static field generating magnet 11 and the gradient field generating coil 12 (which direction will hereinafter be referred to as the static field direction) perpendicularly intersect the direction of the RF magnetic field (hereinafter referred to as the RF direction) from the RF coil 15, the application of the RF field and the detection of the NMR signal can be achieved with the highest efficiency. The NMR-CT apparatus satisfying above conditions are roughly divided into two groups in terms of the magnetic field generating structure. In a group 1 the static field direction and the direction in which a human body is taken into and out of the static field are perpendicular to each other, whereas in a group 2 the both directions are parallel to each other.

Since it is necessary that the static field direction and the RF direction be perpendicular to each other, as referred to above, a solenoid coil is often used as the RF coil in the case of the group 1, and in the case of the group 2 a saddle-shaped coil is usually employed.

The RF coil for detecting the NMR signal is naturally one of important components which determine the SN ratio of the NMR-CT. The solenoid coil is about three times higher than the saddle-shaped coil in RF sensitivity. Recently there has been a strong demand for higher sensitivity, and an RF coil commonly referred to as a surface coil is often used according to the region of examination (limited to regions near the skin surface). Usually the surface coil has a spiral configuration, as shown in FIG. 2A, which is substantially flat and small in the number of turns. The RF field emanating from the surface coil is perpendicular to the coil plane. The surface coil is designed so that the SN ratio of the NMR signal from the region of examination may be maximum taking into account an area of the region of examination. In practical use the surface coil is applied to the skin surface corresponding to the region of examination with the coil plane held in parallel to the skin surface.

As depicted in FIG. 1, a surface coil 21 is connected to the receiver 17 via the receiving coil select circuit 16 which switches between the surface coil 21 and the solenoid coil 15 as required. That is, the RF field is applied to the body from the solenoid coil 15 and the NMR signal from the body is received by the solenoid coil 15 and the surface coil 21, and selectively provided via the receiving coil select circuit 16 to the receiver 17. The receiving coil select circuit 16 selectively connects the automatic transmission/reception switching circuit 14 and the surface coil 21 to the receiver 17. It is possible to arrange such that the solenoid coil 15 and the surface coil 21 are selectively connected to the automatic transmission/reception switching circuit 14, the receiver 17 is connected directly to the automatic transmission/reception switching circuit 14. In this case, if desired, the surface coil 21 may be used both for generation of the RF field and reception of NMR signal.

Chief regions of examination through use of the surface coil are, in the case of the human body, an eye, the breast, the backbone, the heart, the liver, the kidney and so forth. In view of the facts that the human body has an elliptic cross-section in a transverse direction in which the breadth of the body is larger than the thickness of the body, that vertical dimensions of the body are far larger than the dimensions of the transverse cross-section and that the examinee usually lies on his back during examination, it is highly desirable that the surface coil be disposed with its RF direction held vertical.

In this instance, the static field direction must be made horizontal so as to meet the aforementioned requirement that the static field direction and the RF direction be perpendicular to each other.

In the magnet system of the group 2 the static field direction is parallel to the longitudinal axis of the lying human body, and hence is originally horizontal, but in the magnet system of the group 1 the static field direction is conventionally limited specifically to the direction perpendicular to the lying human body. In the group 1 the static field generating means employing permanent magnets is such as shown in FIG. 3 in which different magnetic poles of the permanent magnets 22 and 23 are disposed opposite but spaced apart in the vertical direction and are interconnected via a magnetic yoke 24, setting up a vertical static field 25 between the opposing faces of the magnets 22 and 23. A solenoid coil 26 for the RF magnetic field is disposed in the static magnetic field 25. The axis of the solenoid coil 26 is extended in a horizontal direction and is perpendicular to the static field 25. In the solenoid coil 26 a deck 27 is horizontally disposed in a manner to be slidable in parallel with the axis of the solenoid coil 26 and an examinee 28 lies on the deck 27.

Since the static field direction is vertical, as mentioned above, the magnet system of the group 1 presents the problem that the surface coil cannot be used with its RF direction held vertical.

SUMMARY OF THE INVENTION

An object of the present invention is to provide an NMR-CT apparatus which has the magnet system of the group 1 capable of using the solenoid coil about three times higher in the RF sensitivity than the saddle-shaped coil and which allows to use the surface coil of the vertical RF direction which is effective for examination of the internal organs or regions near the skin surface.

In order to use the solenoid coil for the human body lying horizontally, it is necessary only that the static field direction be perpendicular to the longitudinal axis of the human body; namely, the static field direction need not always be vertical unlike in the past. The NMR-CT apparatus of the present invention has an arrangement which makes the static field direction horizontal and permits an access to the examinee's body in a direction perpendicular to the static field direction in this horizontal plane. The solenoid coil for generating the RF magnetic field is disposed with its axis held perpendicular to the static field direction but parallel to the horizontal direction. The examinee's body is brought into and out of the solenoid coil. Furthermore, provision is made for selectively connect the surface coil and the solenoid coil to the receiver. High-frequency pulses are applied to the solenoid coil or surface coil and an NMR signal is received by either one of the solenoid coil or surface coil and is supplied to the receiver, and then processed to obtain spatial distribution information, which is displayed as an image. In order to increase S/N of received NMR signal, the NMR signals from both the solenoid coil and surface coil may be supplied to the receiver.

Means for generating the static magnetic field may preferably be formed by a plurality of magnet rings each of which comprises a plurality of permanent magnet blocks disposed in the form of a ring so that they provide magnetic fields of substantially one direction within the magnet ring. The magnet rings are arranged side by side with their axes held in agreement with one another to extend in the horizontal direction. It is preferable to provide means for adjusting the position of each magnet block in the radial direction of each magnet ring, in the skew direction about that radial direction and in the tangential direction.

BRIEF DESCRIPTION OF THE DRAWINGS

FIG. 3 is a front view showing the relationships between the static magnetic field, the RF solenoid coil and the examinee's body in the prior art NMR-CT apparatus;

FIG. 4 is a perspective view showing, by way of example, the relative arrangement of static field generating device, gradient field generating means, a solenoid coil and a deck for the examinee which are principal parts of the apparatus of the present invention;

DESCRIPTION OF THE PREFERRED EMBODIMENTS

Figure 5:
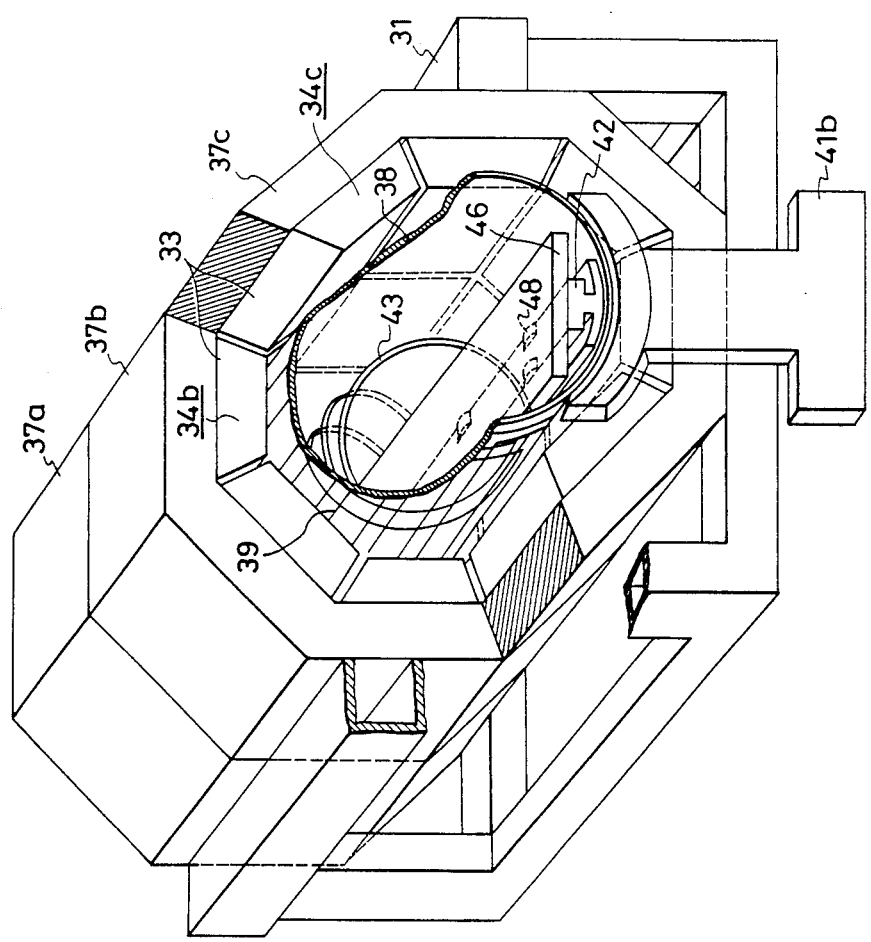
FIG. 5 is a perspective view showing the interior of a static field generating device used in the apparatus depicted in FIG. 4.
Figure 6:
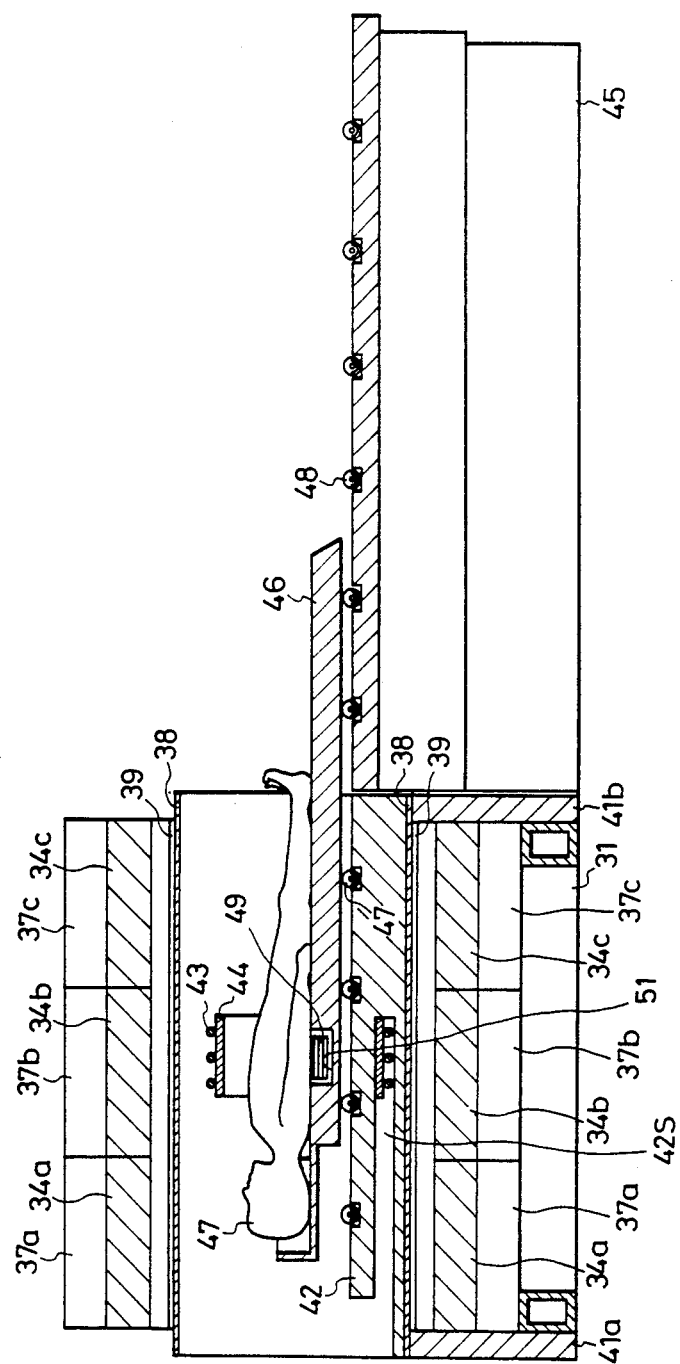
FIG. 6 is a longitudinal-sectional view of the apparatus of FIG. 4 taken along the axis of the static field generating device, with an examinee held therein.

FIGS. 4 to 7 illustrate an embodiment of the present invention. A static magnetic field generating device 32 is mounted on a mount 31. In this embodiment the static field is generated by a permanent magnet assembly through use of a technique disclosed in U.S. Pat. No. 4,498,048. As depicted in FIGS. 4 to 6, three magnet rings 34a, 34b and 34c, each composed of eight anisotropic permanent magnet blocks 33 arranged in the form of a ring, are coaxially aligned in the horizontal direction. The magnet blocks of each magnet ring are respectively magnetized in such directions as indicated by the arrows 35, developing a horizontal static magnetic field 36 inside the magnet ring. The magnet rings 34a, 34b and 34c are respectively secured to magnet support frame means 37a, 37b and 37c outside thereof and the magnet support frame means are fixedly mounted on the mount 31, as shown in FIG. 4.

Figure 8A:
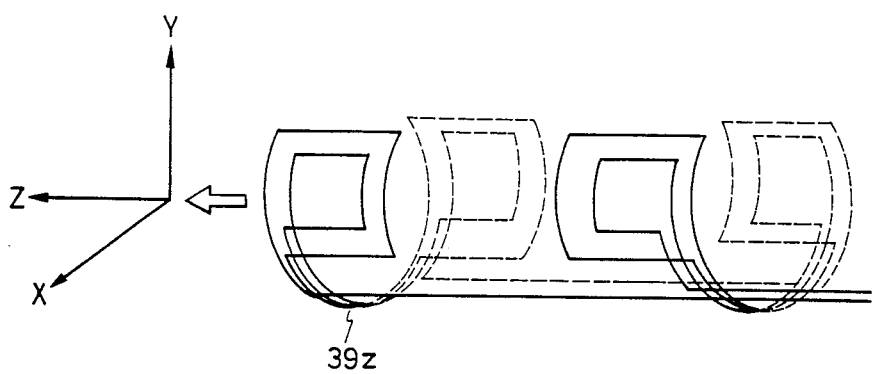
FIG. 8A is a perspective view illustrating an example of the shape of a coil 39z for generating a Z-direction gradient field.
Figure 8B:
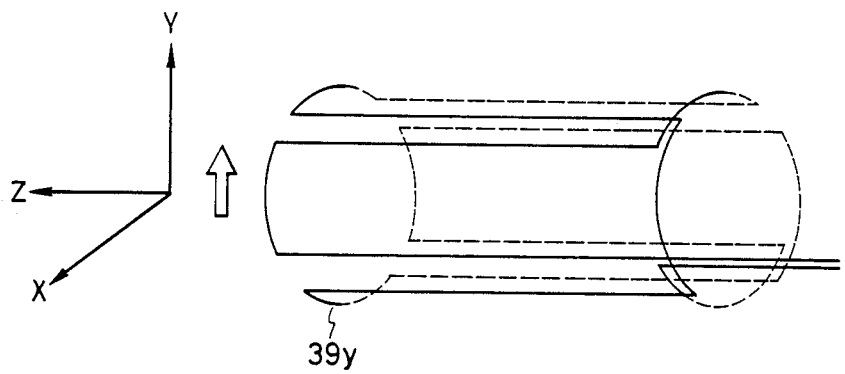
FIG. 8B is a perspective view illustrating an example of the shape of a coil 39y for generating a Y-direction gradient field.
Figure 8C:
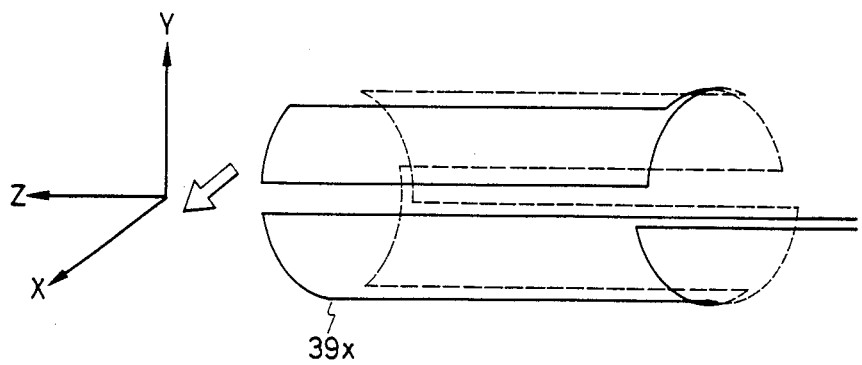
FIG. 8C is a perspective view illustrating an example of the shape of a coil 39x for generating an X-direction gradient field.

As illustrated in FIGS. 5 and 6, a bobbin 38 is disposed inside the magnet rings 34a, 34b and 34c coaxially therewith and a gradient field coil 39 is wound on the bobbin 38. Both ends of the bobbin 38 project outwardly of the magnet rings 34a and 34c and are held on support bases 41a and 41b. The gradient field coil 39 is comprised of a coil 39z for generating a Z-direction gradient field the intensity of which varies in a direction parallel to the axis of the bobbin 38, a coil 39y for generating a Y-direction gradient field the intensity of which varies in the Y-direction and a coil 39x for generating an X-direction field the intensity of which varies in the X-direction. The coil 39z is wound, for instance, in such a form as shown in FIG. 8A and its particulars are disclosed, for example, in Japanese patent application Laid Open No. 15749/84. The coils 39y and 39x are wound on the coil 39z, for example, in such forms as shown in FIGS. 8B and 8C, respectively. Their winding configurations are described in detail in Japanese patent application Laid Open No. 57140/80. These gradient fields are all produced in the Z-direction.

As depicted in FIGS. 5 and 6, a rail 42 is fixedly mounted on the bottom of the bobbin 38 inside thereof to extend in the Z-direction. A slot 42S is cut in the rail 42 to extend from one end to the center thereof in the Z-direction and a solenoid coil 43 is disposed inside the bobbin 38, passing through the slot 42S. The solenoid coil 43 is wound on a bobbin 44 with its axis held in parallel to the Z-axis and is positioned corresponding to the magnet ring 34b. The bobbin 44 is detachably secured to the rail 42.

Figure 7:
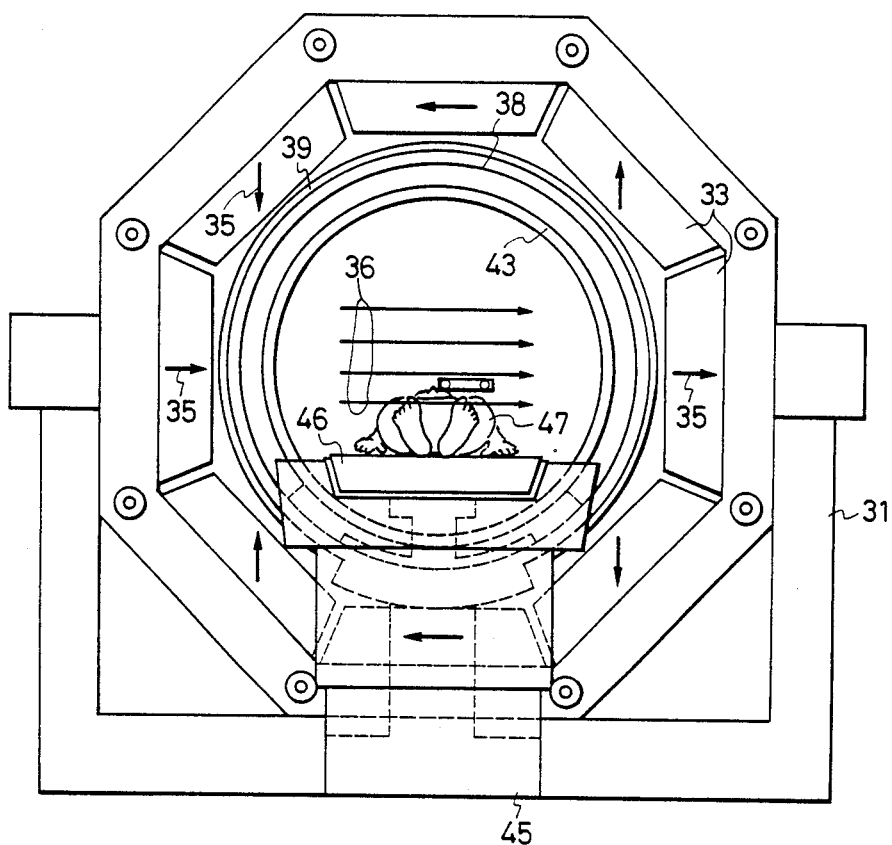
FIG. 7 is a diagram showing an open end portion of the apparatus of FIG. 4.

Substantially in contact with the other end of the rail 42 is provided a bed 45 with its top surface almost flash with that of the rail 42. A carriage 46 for carrying an examinee 47 is mounted on the bed 45 in a manner to be slidable into and out of the bobbin 38. For easy movement of the carriage 46 rollers 48 are attached to the rail 42 and the bed 45 as required. Thus the examinee 47 is brought into and out of the bobbin 38 in a direction perpendicular to the horizontal static magnetic field 36 as shown in FIG. 7 so that the static field 36 is applied perpendicularly to the longitudinal axis of the examinee's body. A recess 51 is made in the carriage 46 for receiving therein a surface coil 49, as required, which allows easy positioning of the examinee's body relative to the surface coil 49 before inserting the body into the bobbin 38.

Figure 9:
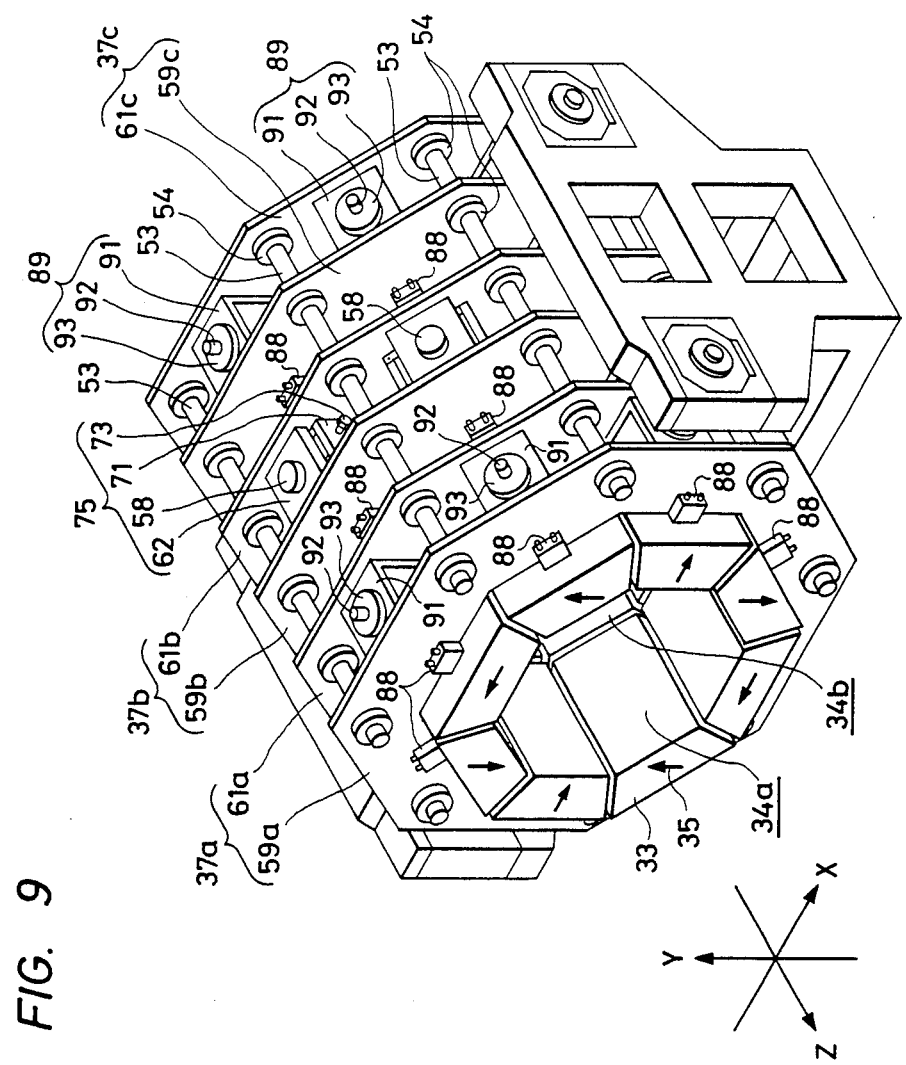
FIG. 9 is a perspective view illustrating the general arrangement of the static field generating device with its cover taken off.

FIG. 9 shows a practical arrangement of the static field generating device 32, wherein each of the magnet support frame means 37a, 37b, 37c is formed by a pair of parallel ring plates 59 and 61 and each magnet block 33 is mounted to the parallel ring plates via position adjusting means as will be explained hereinafter. The magnet blocks are each produced by binding a number of small magnet pieces in combination. In order to establish a homogeneous magnetic field over as large a space as possible, provision is made for adjusting the position of each magnet ring in its axial direction, the position of each magnet block 33 in the radial and tangential directions of the magnet ring and angular position of rotation of the magnet block 33 (i.e. skew of the magnet block 33) about an axis in the radial direction of the magnet ring. The magnet support frame means 37a, 37b and 37c are loosely threaded with common coupling rods 53 and nuts 54 are threadedly engaged with the coupling rods 53 to clamp each support frame means on both sides thereof, fixing it in position. By adjusting the positions of the magnet rings 34a, 34b, and 34c, on the magnet support frame means 37a, 37b, 37c with the nuts 54 loosened, the relative positions of the magnet rings 34a, 34b, 34c in the Z-direction can be adjusted.

Figure 10A:
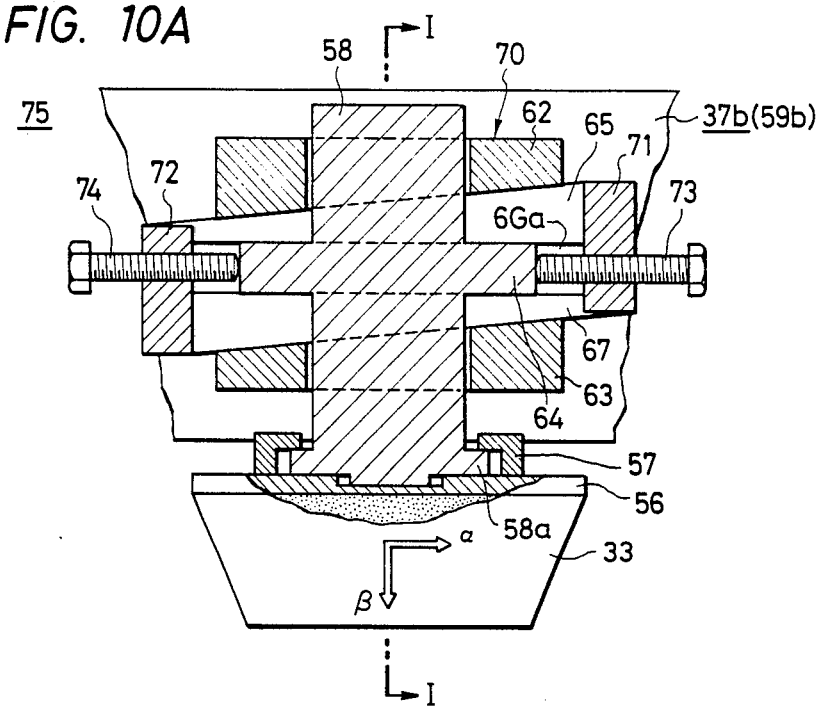
FIG. 10A is a cross-sectional view taken on the axis of a shaft, illustrating an example of a radial direction adjustment wedge mechanism 75.
Figure 10B:
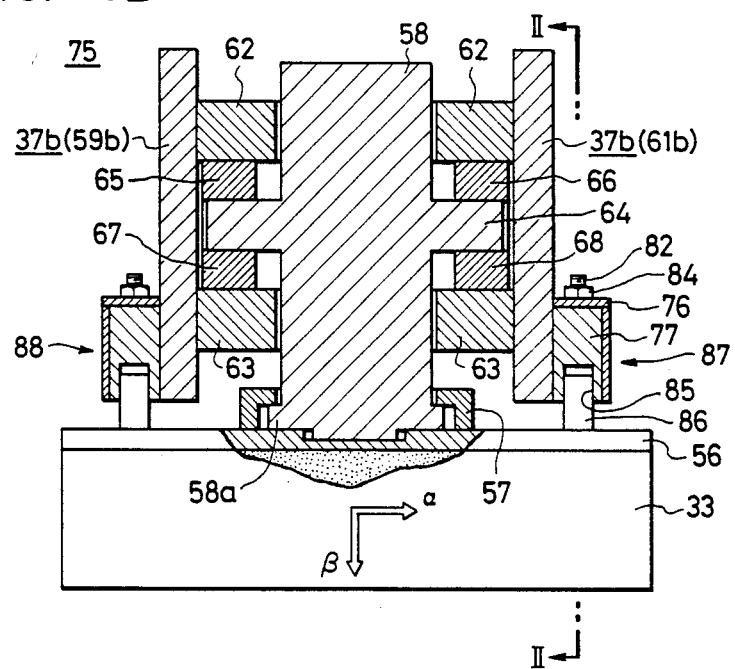
FIG. 10B is a cross-sectional view taken on the line I—I in FIG. 10A.
Figure 11:
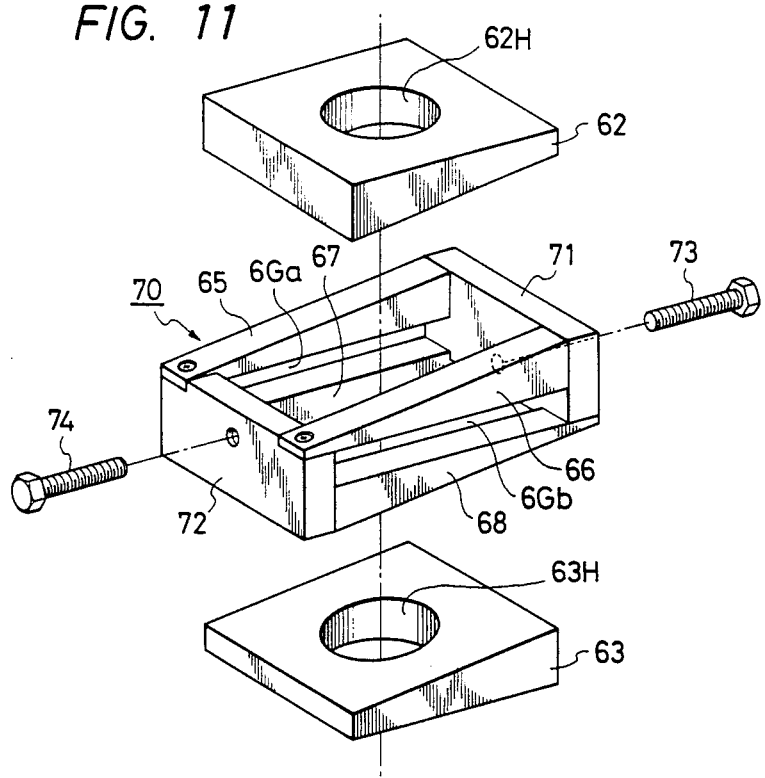
FIG. 11 is an exploded perspective view of part of the wedge mechanism shown in FIGS. 10A and 10B.

As depicted in FIG. 9, there are provided a plurality of radial adjusting means 75, 89 between each pair of ring plates 59, 61 to fixedly connect them with each other. In addition, tangential/skew adjusting means 87, 88 are fixedly mounted to each pair of the ring plates on both outer side thereof in a corresponding relation to the respective magnet blocks of each magnet ring. In the illustrated embodiment the radial adjusting means 75 for each magnet block 33 of the inner magnet ring 34b is formed as a wedge type adjusting mechanism. FIGS. 10A, 10B and 11 show an example of the wedge type radial adjustment mechanism. An engaging ring 57 is mounted on a back plate 56 of the magnet block 33 and a rod 58 is engaged at one end thereof with the engaging ring 57 through its flange 58a so that the rod 58 is rotatably mounted on the magnet block 33. As will be understood from FIGS. 9 to 11, the pair of opposed ring plates 59b and 61b are interconnected through a pair of wedge plates 62 and 63 at the position of each magnet block 33. The abovementioned rod 58 is received in holes 62H, 63H made in the wedge plates 62 and 63. The rod 58 has an engaging flange 64 formed integrally therewith between the wedge plates 62 and 63. As shown in FIG. 11, a pair of upper wedge bars 65, 66 are fixedly attached at thicker ends thereof to upper side corners of a coupling plate 71 and a pair of lower wedge bars 67, 68 are similarly fixed to lower side corners of a coupling plate 72. The thinner ends of the wedge bars 65, 66 and 67, 68 are connected to the upper and lower ends of the opposite coupling plates 72 and 71, respectively, so as to form a wedge frame 70 having rectangular guide apertures 6Ga and 6Gb defined between the wedge bars 65 and 67 and between the wedge bars 66 and 68. The wedge frame 70 is slidably interposed between the upper and lower wedge plates 62 and 63. The rod 58 is engaged with the wedge frame 70 to extend through between the wedge bars 65 and 66 and between the wedge bars 66 and 68, with radially opposite parts of the engaging flange 64 being slidably disposed in the guide apertures 6Ga, 6Gb. The coupling plates 71 and 72 have made therein threaded holes, in which bolts 73 and 74 are threadedly received with their tips abutted against the peripheral surface of the engaging flange 64. In this way, a radially adjusting wedge mechanism 75 is formed.

When turning the bolt 73 to urge it against the engaging flange 64 after turning the bolt 74 to release itself from the flange 64 in FIG. 10A, the wedge frame 70 is pulled out in a direction in which the coupling plate 71 moves away from a center axis of the rod 58. Since the wedge plates 62 and 63 are fixed to the ring plates 59b, 61b, the engaging flange 64 is pushed up to move the rod 58 and the magnet block 33 in a direction opposite from the arrow $\beta$, that is, radially of the magnet ring 34b away from its axis. Conversely, when the bolt 74 is turned to be urged against the engaging flange 64 with the bolt 73 disengaged therefrom, the magnet block 33 moves in a direction of the arrow $\beta$. In this way, the position of the magnet block 33 can be adjusted radially thereof.

The radially adjusting wedge mechanism permits fine control but is somewhat complex in structure. The outer magnet rings 34a and 34c do not call for such fine control as is needed for the magnet ring 34b sandwiched therebetween. That is, adjustment of the magnet ring 34b, even if slight, will exert a great influence. From this viewpoint, only a simple bolt type adjustment mechanism 89 is employed in place of the radial adjusting wedge mechanism 75 for each magnet block in the outer magnet rings 34a, 34c as shown in FIG. 9. The bolt type adjustment mechanism 89 has an arrangement in which a threaded rod 92 is screwed into a hole made in a disk 93 mounted on coupling plate 91 joining the pair of ring plates (59a, 61a; 59c, 61c) and are rotatably connected at one end to the magnet blocks 33. By turning the threaded rods 92, the magnet blocks 33 are moved back and forth radially of the magnet ring.

Figure 12:
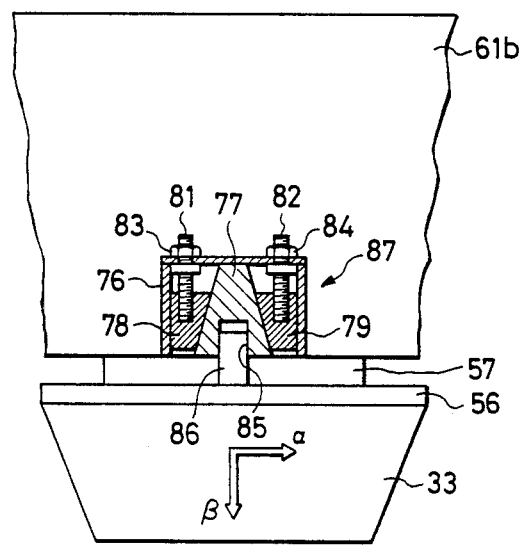
FIG. 12 is a cross-sectional view taken on the line II—II in FIG. 11, showing a wedge mechanism 87.

The tangential/skew adjusting means 87, 88 is provided in association with each magnet block 33 on outer sides of each pair ring plates 59, 61 as shown in FIG. 9 and will be explained hereinafter with respect to FIGS. 10B and 12. On the outside of the ring plate 61 opposite from the rod 58 is fixedly mounted a wedge case 76 above the back plate 56 of the magnet block 33, as depicted in FIGS. 10B and 12. The wedge case 76 is open on the side of the magnet block 33 and has disposed therein an engaging wedge piece 77. In the wedge case 76 wedges 78 and 79 are pressed into between side panels of the case 76 and the engaging wedge piece 77. Bolts 81 and 82 are threadedly received by the wedges 78 and 79 through holes made in an upper end face of the wedge case 76 in alignment with the wedges 78 and 79, respectively. The bolts 81 and 82 are fixed to the wedge case 76 by means of nuts 83 and 84. An engaging hole 85 is made in the larger end face of the engaging wedge piece 77 adjacent the back plate 56 and a pin planted on the back plate 56 is slidably received in the engaging hole 85. Thus the tangential/skew adjusting means 87 is constructed as a wedge mechanism. In a similar manner the tangential/skew adjusting means 88 is constructed as a wedge mechanism.

In FIG. 12, in the case where the bolt 82 is turned to move the wedge 79 away from the magnet block 33 to loosen the engagement, and then the bolt 81 is turned to move the wedge 78 toward the magnet block 33, the engaging wedge piece 77 is driven to move the pin 86 and the magnet block 33 to the right-hand side, i.e. in a direction of the arrow $\alpha$. Conversely, when the wedge 79 is pushed down after the wedge 78 is pulled up away from the magnet block 33, the engaging wedge piece 77 is driven to shift the pin 86 and the magnet block 33 in a direction opposite from the arrow $\alpha$.

The wedge mechanism 88 works in a manner similar to that of the wedge mechanism 87. Accordingly, by concurrent adjustment of the both wedge mechanisms 87 and 88 to displace the magnet block 33 in the direction of the arrow $\alpha$ or in the opposite direction, it is possible to adjust the position of the magnet block 33 in the tangential direction of the magnet ring 34b. Furthermore, by adjusting the both wedge mechanisms 87 and 88 in the opposite directions, the magnet block 33 can be skewed about the rod 58.

According to our experiment in which the magnet rings 34a, 34b and 34c were each comprised of eight magnet blocks 33, each of which was produced by binding a number of rare earth iron magnets (measuring 50×30×20 mm) of Nd-Fe-B series whose residual magnetism was in the range of 12.0 to 12.6K gausses, a homogeneous magnetic field with a difference between maximum and minimum field intensities held within 30 ppm was obtained inside a cylindrical plane with a radius of 175 mm from the center of each magnet ring. With the arrangement of the present invention, a homogeneous magnetic field can be obtained in a wide space. In particular, sufficiently high resolution can be obtained even if magnetic fields are applied to the examinee's body horizontally along the longer diameter of the elliptical cross-section of the body.

Figure 1:
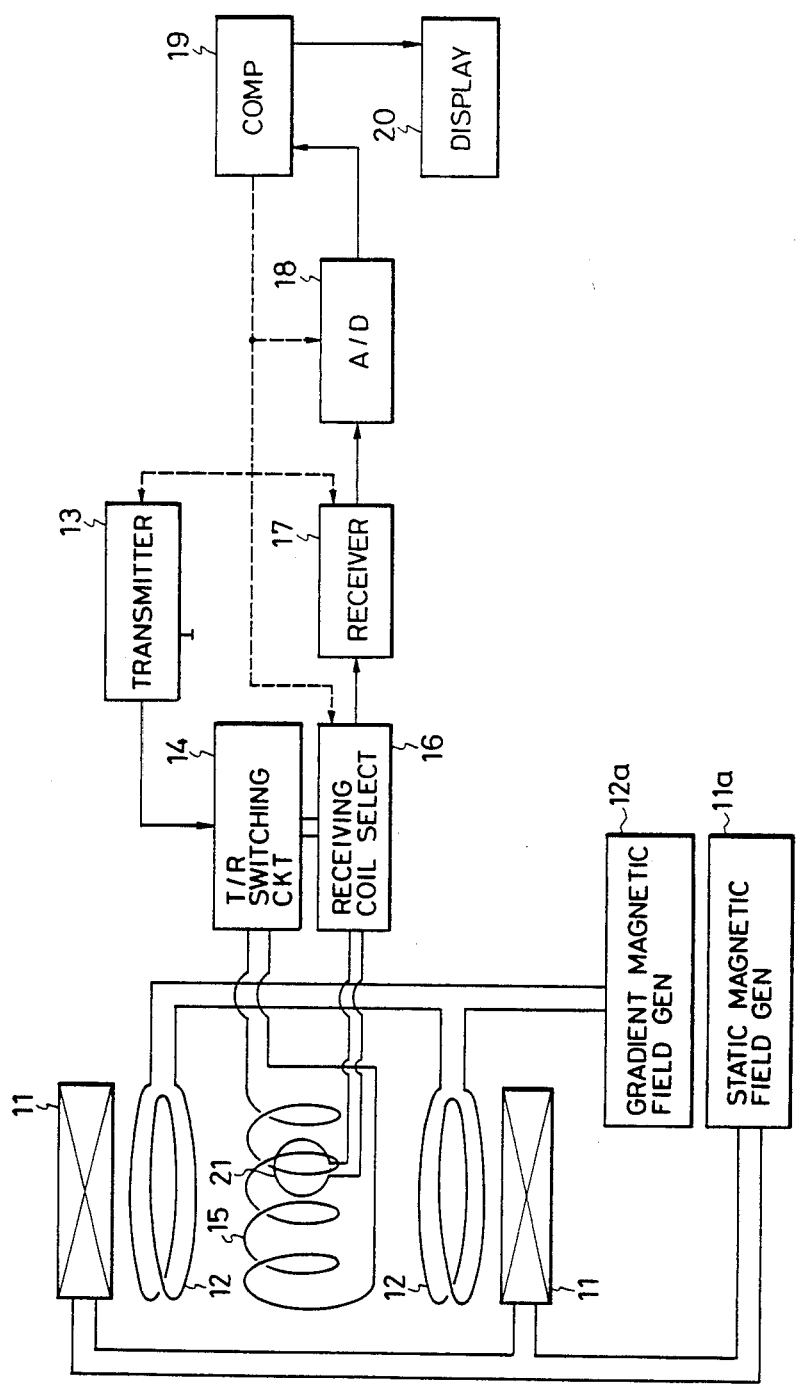
FIG. 1 is a block diagram illustrating the general arrangement of an NMR-CT apparatus.
Figure 2A:
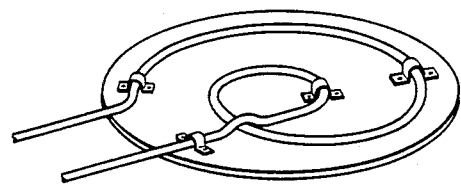
FIGS. 2A through 2C are perspective views showing various examples of surface coils.
Figure 2B:
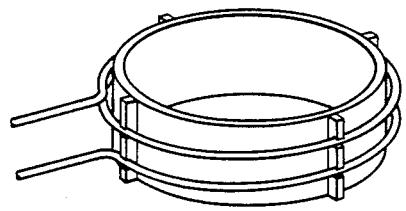
Figure 2C:
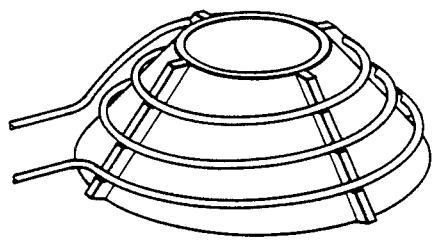

With the arrangement shown in FIGS. 4 to 7, the examinee lying on his back or stomach on the carriage 46 is brought into and out of the bobbin 38, that is, along the axial direction of the solenoid coil 43 for generating the RF magnetic field. Accordingly, an NMR signal of high SN ratio can be obtained through utilization of the solenoid coil 43, so that a tomographic image of the examinee 47 can be produced. It is also possible to exchange the solenoid coil 43 with another one of a diameter corresponding to the size of a particular part of the examinee's body such as the head, the trunk or the like. When it is desired to limit the examination to a small specified region of the examinee's body, the surface coil 49 of a solenoid type such as shown in FIG. 2B can be placed under or on the examinee's body 47 to obtain the NMR signal from the target region. The shape of the surface coil can be selected in accordance with the surface configuration of a particular region of examination. For example, in the case of examining the breast, such a spiral surface coil of a cone-shape as shown in FIG. 2C may be used. In any case, since the static magnetic field is horizontal, the surface coil 49 can be disposed with its RF direction held vertically, permitting effective examination of various parts of the examinee's body. Moreover, S/N of the received signal can be further improved by obtaining NMR signals from both the solenoid coil 43 and the surface coil 49 and supplying them to the receiver 17.

Figure 13:
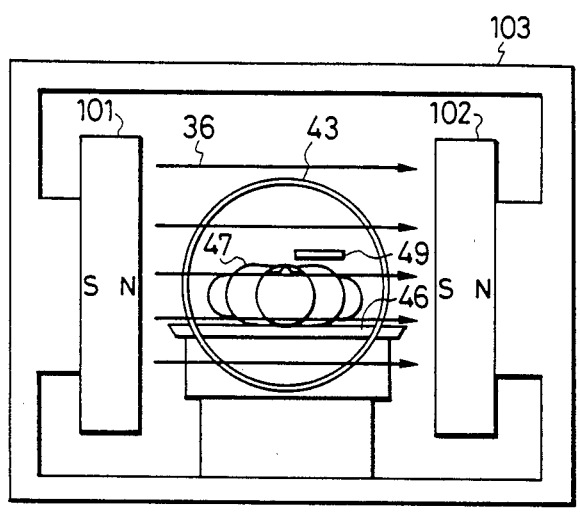
FIG. 13 is a diagram corresponding to FIG. 3, illustrating an example of the present invention in which the static field is generated by a permanent magnet having its two poles disposed opposite.

The static field generating means is not limited specifically to the magnet device previously described but may also be such, for example, as shown in FIG. 13. In FIG. 13 different magnetic poles of permanent magnets 101 and 102 are disposed in opposing relation so that the horizontal static magnetic field 36 is set up therebetween. In the static field 36 is disposed the RF field generating solenoid coil 43, together with a gradient field generating coil though not shown. The axis of the solenoid coil 43 is horizontal and perpendicularly crosses the direction of the static field 36. The carriage 46 is disposed so that it is slid into and out of the solenoid coil 43 in parallel to its axis. That is, the examinee is brought into and out of the static field perpendicularly thereto from the horizontal direction. The magnets 101 and 102 are interconnected via a magnetic yoke 103. That is, the opposed magnets 101 and 102 are disposed on the left and right of the examinee's body 47 so that the static field 36 is horizontally directed and is perpendicular to the longitudinal axis of the examinee's body 47.

With such an arrangement, the solenoid coil 43 can be employed for the purpose of obtaining a uniform tomographic image of the entire region of the head or the body of the examinee 47. In addition, in the case of limiting examination to a specified narrow region, it is also possible to place the surface coil 49 under or on the examinee's body 47.

Figure 14:
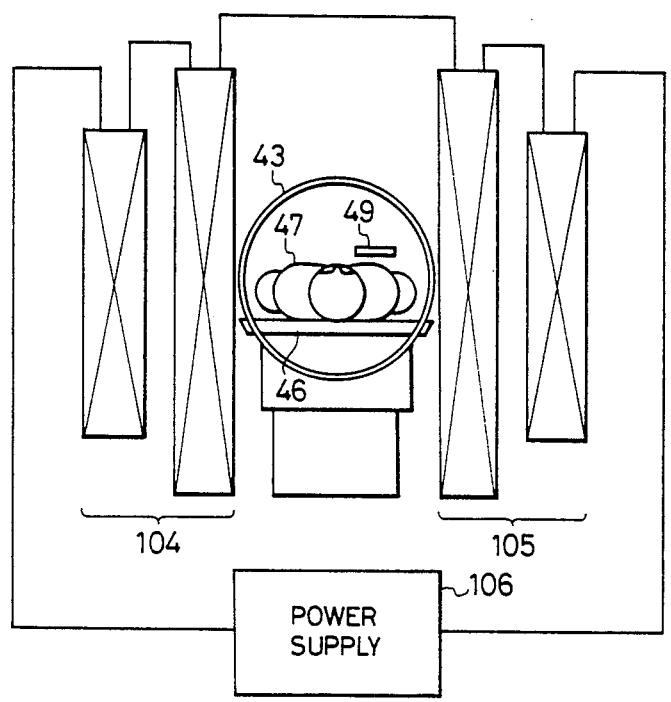
FIG. 14 is a diagram corresponding to FIG. 13, illustrating another example of the present invention which employs resistive magnets for generating the static field.

In the case of using resistive magnets, an arrangement such as depicted in FIG. 14 is employed, in which static field coils 104 and 105 are arranged horizontally in opposing relation, so that their axes are horizontal. The RF field generating solenoid coil 43 and the carriage 46 are disposed between the static field coils 104 and 105. The static field coils 104 and 105 are excited by a power supply 106. The gradient field generating coil is also provided, though not shown.

As described above, according to the NMR-CT apparatus of the present invention, a solenoid coil of high sensitivity is used and a surface coil can be employed with its RF direction held vertical. Accordingly, it is possible to use an RF coil most suitable for a particular region for examination at all times.

It will be apparent that many modifications and variations may be effected without departing from the scope of the novel concepts of the present invention.

What is claimed is:

1. An apparatus for obtaining image information through use of a nuclear magnetic resonance signal, comprising:
   static field generating means for generating a static magnetic field which is horizontal and perpendicularly intersects the longitudinal axis of a horizontally-extending body to be examined;
   gradient field generating means, having three axes intersecting perpendicularly to one another, for generating in the static magnetic field a gradient magnetic field whose intensity is graded along respective ones of said three axes and whose direction is parallel to the static magnetic field, one of said three axes being parallel to the static magnetic field;
   a solenoid coil provided in the static magnetic field with its axis held horizontal and perpendicular to the direction of the static magnetic field, the solenoid coil defining inside thereof a cylindrical space in which the body extends in parallel relation to the axis of the solenoid coil;
   a substantially flat surface coil disposed in the static magnetic field over a desired region of the body and with its face held in opposing relation to the surface of the region;
   transmitting means, connected selectively to the solenoid coil and the surface coil, for supplying high-frequency pulses selectively to the solenoid coil and the surface coil;
   receiving means, connected selectively to the solenoid coil and the surface coil, for detecting the nuclear magnetic resonance (NMR) signal from the body received selectively by the solenoid coil and the surface coil, and for providing the detected NMR signal as NMR data in a digital form; and
   computer means, connected to the receiving means, for storing the NMR data from the receiving means and obtaining spatial distribution of information contained in the detected NMR signal.

2. Apparatus according to claim 1 wherein the static field generating means comprises a plurality of magnet rings, each composed of a plurality of permanent magnet blocks arranged in the form of a ring, the magnet rings below arranged coaxially in the horizontal direction.

3. Apparatus according to claim 2 wherein a gradient magnetic field coil is disposed, as a gradient field generating means, inside the magnet rings and the solenoid coil is disposed inside the gradient magnetic field coil coaxially with the magnet rings.

4. Apparatus according to claim 3 wherein a bobbin is disposed inside the magnet rings substantially coaxially therewith and the gradient magnetic field coil is wound on the bobbin.

5. Apparatus according to claim 4 wherein a rail is fixedly mounted in the bobbin and a carriage for carrying the examinee is slidably mounted on the rail in parallel to the axis of the bobbin.

6. Apparatus according to claim 5 wherein a slot is formed in the rail to extend from the farthest end to the center thereof and the solenoid coil is disposed inside the bobbin with a circumferential part of the solenoid coil is inserted in the slot.

7. Apparatus according to claim 6, comprising plural pairs of ring frames disposed around the respective magnet rings for fixedly supporting the magnet rings.

8. Apparatus according to claim 7 further comprising radial position adjustment means disposed between each pair of the ring frames and attached thereto for adjusting the position of the magnet block of each magnet ring in the radial direction of the ring and tangential position adjustment means mounted on each pair of the ring frames for adjusting the position of each magnet block in its tangential direction.

9. Apparatus according to claim 8 further comprising skew adjustment means for adjusting the skew of each magnet block of each magnet ring about an axis in the radial direction of the ring.

10. Apparatus according to claim 9 wherein the tangential position adjustment means is provided at on both outer sides of each pair of the ring frames in opposing relation to each other angular position corresponding to each magnet block and these tangential adjustment means perform the function of the skew adjustment means as well.

11. Apparatus according to claim 8 wherein the radial position adjustment means for the inner one of the magnet rings is higher in the precision of adjustment than those for the outer magnet rings.

12. Apparatus according to claim 11 wherein the radial position adjustment means for the inner magnet ring is formed by a wedge mechanism.

13. Apparatus according to claim 1, wherein both the solenoid coil and the surface coil are connected to the receiving means via a coil selecting means for selectively supplying the received NMR signal from at least one of the solenoid coil and the surface coil to the receiving means.

14. Apparatus according to claim 1, wherein the surface coil is of a solenoid type.

15. Apparatus according to claim 1, wherein the surface coil is of a cone-shaped spiral.

16. Apparatus according to claim 1, wherein a carriage is slidably mounted on a rail extending into the static magnetic field in a horizontal direction perpendicular to the direction of the static magnetic field so as to bring the examinee's body into and out of the static magnetic field and the surface coil is mounted on the carriage.

* * * * *

UNITED STATES PATENT AND TRADEMARK OFFICE
CERTIFICATE OF CORRECTION

PATENT NO.  :  4,727,327
DATED       :  February 23, 1988
INVENTOR(S) :  Hideo Toyoshima and Masaya Yamashita It is certified that error appears in the above-identified patent and that said Letters Patent is hereby corrected as shown below:

On the title page Insert:

-- [73] Assignee:  Asahi Kasei Kogyo Kabushiki Kaisha
                   Osaka, Japan   --.

Signed and Sealed this

Twenty-third Day of May, 1989

*Attest:*

DONALD J. QUIGG

*Attesting Officer*   *Commissioner of Patents and Trademarks*